(12) United States Patent
Togashi (10) Patent No.: US 7,881,040 B2
(45) Date of Patent: Feb. 1, 2011

(54) FEEDTHROUGH CAPACITOR MOUNTED STRUCTURE

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 336 days.

(21) Appl. No.: 12/250,870

(22) Filed: Oct. 14, 2008

(65) Prior Publication Data
US 2009/0141421 A1     Jun. 4, 2009

(30) Foreign Application Priority Data
Nov. 29, 2007   (JP)   ............................. 2007-308934

(51) Int. Cl.
*H01G 4/35* (2006.01)
(52) U.S. Cl. .................. 361/302; 361/303; 361/305; 361/306.1; 361/306.3; 361/313
(58) Field of Classification Search ................ 361/302, 361/303–305, 321.1, 321.2, 306.1, 306.3, 361/311–313, 301.1, 301.4; 333/182–185
See application file for complete search history.

(56) References Cited

U.S. PATENT DOCUMENTS

| | | | |
|---|---|---|---|
| 6,344,961 B1 | 2/2002 | Naito et al. | |
| 6,542,352 B1 * | 4/2003 | Devoe et al. | ............. 361/321.2 |
| 6,754,064 B2 | 6/2004 | Azuma et al. | |
| 7,035,076 B1 * | 4/2006 | Stevenson | ................... 361/302 |
| 7,432,784 B2 * | 10/2008 | Togashi | ...................... 333/185 |
| 7,580,240 B2 * | 8/2009 | Yamamoto et al. | ........... 361/311 |
| 7,623,337 B2 * | 11/2009 | Togashi | ...................... 361/303 |
| 7,630,208 B2 * | 12/2009 | Lee et al. | .................... 361/766 |

FOREIGN PATENT DOCUMENTS

| | | |
|---|---|---|
| JP | A-2001-148325 | 5/2001 |
| JP | A-2003-282348 | 10/2003 |
| JP | A-2007-129046 | 5/2007 |
| KR | 2001-49257 | 6/2001 |
| KR | 2003-77399 | 10/2003 |

* cited by examiner

*Primary Examiner*—Nguyen T Ha
(74) *Attorney, Agent, or Firm*—Oliff & Berridge, PLC (57) ABSTRACT

A feedthrough capacitor having a pair of first terminal electrodes and a second terminal electrode is mounted on a mounting surface of a substrate. The substrate is an insulating substrate internally having first and second conductor portions isolated from each other, and has a plurality of first via holes, a plurality of second via holes, a plurality of first land electrodes, and a second land electrode. The first via holes and the second via holes, when viewed from the mounting surface side, are arranged in a matrix pattern and alternately arranged in a row direction and in a column direction. The feedthrough capacitor, when viewed from the mounting surface side, is located between a pair of said first via holes adjacent to each other in a direction intersecting with the row direction and also adjacent to each other in a direction intersecting with the column direction. The pair of first terminal electrodes are connected to the respective first land electrodes corresponding to the pair of adjacent first via holes. The second terminal electrode is connected to the second land electrode.

3 Claims, 5 Drawing Sheets

FEEDTHROUGH CAPACITOR MOUNTED STRUCTURE

BACKGROUND OF THE INVENTION

1. Field of the Invention

The present invention relates to a feedthrough capacitor mounted structure in which a feedthrough capacitor is mounted on a substrate.

2. Related Background Art

A known mounted structure of this type is the one described, for example, in Japanese Patent Application Laid-open No. 2007-129046. In the mounted structure described in No. 2007-129046, grid terminals are arranged in a matrix pattern on a multilayer substrate. A feedthrough capacitor is placed above one grid terminal and terminal electrodes of the feedthrough capacitor are soldered to respective grid terminals located around this one grid terminal.

SUMMARY OF THE INVENTION

In the mounted structure described in No. 2007-129046, the multilayer substrate has power-supply grid terminals and ground-electrode grid terminals as the grid terminals. The power-supply grid terminals and the ground-electrode grid terminals are alternately arranged in the row direction and in the column direction, thereby keeping ESL of the substrate low.

Incidentally, there is the grid terminal located under the feedthrough capacitor in the mounted structure described in No. 2007-129046. The grid terminal located under the feedthrough capacitor is not connected to either of the terminal electrodes of the feedthrough capacitor. In addition, it is extremely difficult to connect the grid terminal located under the feedthrough capacitor, to a terminal electrode of another external element. Therefore, the grid terminal under the feedthrough capacitor is not in use. There are unused grid terminals as many as feedthrough capacitors mounted on the substrate. For this reason, the mounting density becomes lower on the substrate.

An object of the present invention is therefore to provide a feedthrough capacitor mounted structure capable of achieving increase in the mounting density while suppressing increase in ESL.

The present invention provides a feedthrough capacitor mounted structure in which a feedthrough capacitor is mounted on a mounting surface of a substrate, wherein the substrate is an insulating substrate internally having first and second conductor portions isolated from each other, and comprises a plurality of first via holes extending from the mounting surface to the first conductor portion, a plurality of second via holes extending from the mounting surface to the second conductor portion, a plurality of first land electrodes formed at respective positions corresponding to the first via holes on the mounting surface and connected to the corresponding first via holes, and a second land electrode formed on the mounting surface and connected to the second via holes in an isolated state from the first land electrodes, wherein the first via holes and the second via holes, when viewed from the mounting surface side, are arranged in a matrix pattern and alternately arranged in a row direction and in a column direction, wherein the feedthrough capacitor comprises an element body having a longitudinal direction, a pair of first terminal electrodes arranged on a pair of first end faces of the element body opposed in the longitudinal direction, and a second terminal electrode arranged on a second end face of the element body perpendicular to the longitudinal direction, wherein the feedthrough capacitor, when viewed from the mounting surface side, is located between a pair of first via holes adjacent to each other in a direction intersecting with the row direction and also adjacent to each other in a direction intersecting with the column direction, wherein the pair of first terminal electrodes are connected to the respective first land electrodes corresponding to the pair of adjacent first via holes, and wherein the second terminal electrode is connected to the second land electrode.

According to the present invention, the first via holes connected to the first conductor layer and the second via holes connected to the second conductor layer are alternately arrayed in the row direction and in the column direction on the substrate. For this reason, directions of electric currents flowing through two adjacent via holes are opposite to each other, which can keep the ESL of the substrate low.

The feedthrough capacitor is located between the first via holes adjacent to each other in the direction intersecting with the row direction and also adjacent to each other in the direction intersecting with the column direction. Namely, the feedthrough capacitor is located between the first via holes adjacent in an oblique direction. Since the first via holes and the second via holes are alternately arranged in the row direction and in the column direction, there is no via hole between the first via holes adjacent in the oblique direction. Therefore, no via hole is hidden under the feedthrough capacitor when the feedthrough capacitor is mounted. For this reason, the feedthrough capacitor is mounted without existence of any unused via hole, which can increase the mounting density. Since there is no via hole under the feedthrough capacitor, the configuration of the present invention prevents a solder from flowing into a via hole under the feedthrough capacitor during soldering of the first terminal electrode of the first feedthrough capacitor. As a result, this configuration can reduce mounting failure.

The distance between the via holes adjacent in the oblique direction is larger than the distance between the via holes adjacent in the row direction or in the column direction. For this reason, even if the distance between the via holes adjacent in the row direction or in the column direction is set to a relatively smaller value, the feedthrough capacitor can be mounted without any problem. Therefore, the array pitch of via holes can be set to a smaller value. When the array pitch of via holes is smaller, the first via holes become closer to the second via holes, which can further reduce the ESL of the substrate. Since the array pitch of via holes is smaller, the number of via holes per predetermined area on the substrate increases. The increase in the number of via holes enables a larger number of feedthrough capacitors to be mounted on the substrate, which can further increase the mounting density.

The present invention provides another feedthrough capacitor mounted structure in which first and second feedthrough capacitors are mounted on a mounting surface of a substrate, wherein the substrate is an insulating substrate internally having first and second conductor portions isolated from each other, and comprises a plurality of first via holes extending from the mounting surface to the first conductor portion, a plurality of second via holes extending from the mounting surface to the second conductor portion, a plurality of first land electrodes formed at respective positions corresponding to the first via holes on the mounting surface and connected to the corresponding first via holes, and a second land electrode formed on the mounting surface and connected to the second via holes in an isolated state from the first land electrodes, wherein the first via holes and the second via holes, when viewed from the mounting surface side, are arranged in a matrix pattern and alternately arranged in a row direction and in a column direction, wherein each of the first and second feedthrough capacitors comprises an element body having a longitudinal direction, a pair of first terminal electrodes arranged on a pair of faces of the element body opposed in the longitudinal direction, and a second terminal electrode arranged on a face of the element body perpendicular to the longitudinal direction, wherein each of the first and second feedthrough capacitors, when viewed from the mounting surface side, is located between a pair of first via holes adjacent to each other in a direction intersecting with the row direction and also adjacent to each other in a direction intersecting with the column direction, wherein the pair of first terminal electrodes are connected to the respective first land electrodes corresponding to the pair of adjacent first via holes, wherein the second terminal electrode is connected to the second land electrode, wherein one first via hole out of the pair of first via holes between which the first feedthrough capacitor is located, is the same as one first via hole out of the pair of first via holes between which the second feedthrough capacitor is located, and wherein the other first via hole out of the pair of first via holes between which the first feedthrough capacitor is located, is opposed to the other first via hole out of the pair of first via holes between which the second feedthrough capacitor is located, with the second via hole in between.

According to the present invention, the first via holes and the second via holes are alternately arrayed in the row direction and in the column direction on the substrate, which can keep the ESL of the substrate low. Since each feedthrough capacitor is located between the first via holes adjacent in an oblique direction, no via hole is located under the feedthrough capacitor when the feedthrough capacitor is mounted. Therefore, it is feasible to prevent existence of an unused via hole and to increase the mounting density. Since a plurality of feedthrough capacitors are connected through one first via hole, the mounting density can be further increased.

The present invention provides still another feedthrough capacitor mounted structure in which first to fourth feedthrough capacitors are mounted on a mounting surface of a substrate, wherein the substrate is an insulating substrate internally having first and second conductor portions isolated from each other, and comprises a plurality of first via holes extending from the mounting surface to the first conductor portion, a plurality of second via holes extending from the mounting surface to the second conductor portion, a plurality of first land electrodes formed at respective positions corresponding to the first via holes on the mounting surface and connected to the corresponding first via holes, and a second land electrode formed on the mounting surface and connected to the second via holes in an isolated state from the first land electrodes, wherein the first via holes and the second via holes, when viewed from the mounting surface side, are arranged in a matrix pattern and alternately arranged in a row direction and in a column direction, wherein each of the first to fourth feedthrough capacitors comprises an element body having a longitudinal direction, a pair of first terminal electrodes arranged on a pair of faces of the element body opposed in the longitudinal direction, and a second terminal electrode arranged on a face of the element body perpendicular to the longitudinal direction, wherein each of the first to fourth feedthrough capacitors, when viewed from the mounting surface side, is located between a pair of first via holes adjacent to each other in a direction intersecting with the row direction and also adjacent to each other in a direction intersecting with the column direction, wherein the pair of first terminal electrodes are connected to the respective first land electrodes corresponding to the pair of adjacent first via holes, wherein the second terminal electrode is connected to the second land electrode, wherein one first via hole out of the pair of first via holes between which the first feedthrough capacitor is located, is the same as one first via hole out of the pair of first via holes between which the second feedthrough capacitor is located, wherein the other first via hole out of the pair of first via holes between which the first feedthrough capacitor is located, is opposed to the other first via hole out of the pair of first via holes between which the second feedthrough capacitor is located, with the second via hole in between, and is the same as one first via hole out of the pair of first via holes between which the third feedthrough capacitor is located, wherein the other first via hole out of the pair of first via holes between which the third feedthrough capacitor is located, is opposed to the one first via hole out of the pair of first via holes between which the first feedthrough capacitor is located, with the second via hole in between, and is the same as one first via hole out of the pair of first via holes between which the fourth feedthrough capacitor is located, and wherein the other first via hole out of the pair of first via holes between which the fourth feedthrough capacitor is located, is the same as the other first via hole out of the pair of first via holes between which the second feedthrough capacitor is located.

According to the present invention, the first via holes and the second via holes are alternately arrayed in the row direction and in the column direction on the substrate, which can keep the ESL of the substrate low. Since each feedthrough capacitor is located between the first via holes adjacent in an oblique direction, there is no via hole under the feedthrough capacitor. Therefore, no unused via hole exists. As a consequence, it becomes feasible to increase the mounting density. Since the four feedthrough capacitors are arranged so as to surround one second via hole, the vector sum of electric current components of the four feedthrough capacitors can be made smaller. Namely, magnetic fields caused by electric currents cancel each other out in the four feedthrough capacitors, which can further decrease the ESL.

The present invention successfully provides the feedthrough capacitor mounted structures capable of increasing the mounting density while suppressing increase in ESL.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference symbols, without redundant description.

First Embodiment

Figure 1:
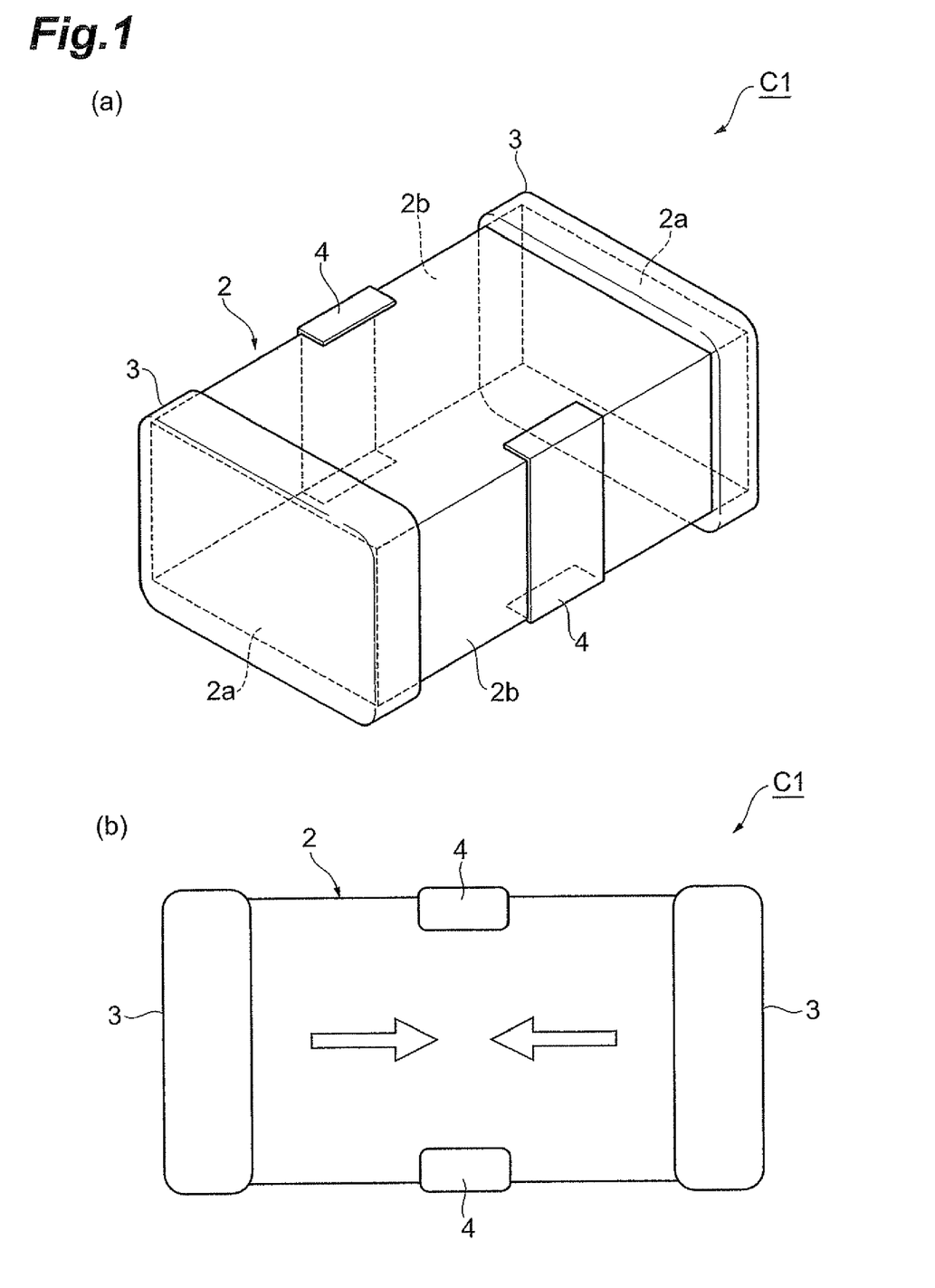
FIG. 1 is a perspective view of a feedthrough capacitor according to the first embodiment.
Figure 2:
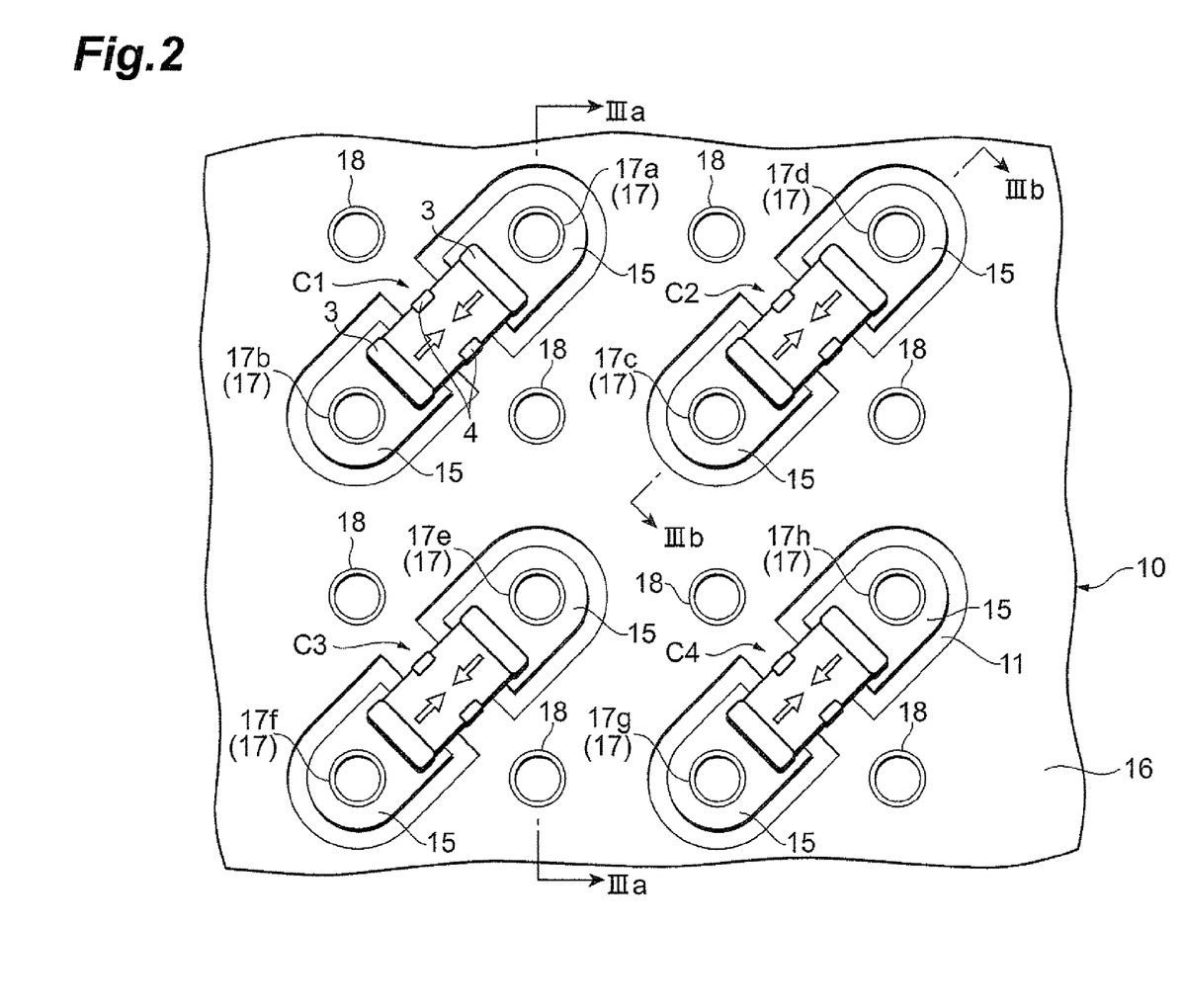
FIG. 2 is a top plan view of the feedthrough capacitor according to the first embodiment.
Figure 3:
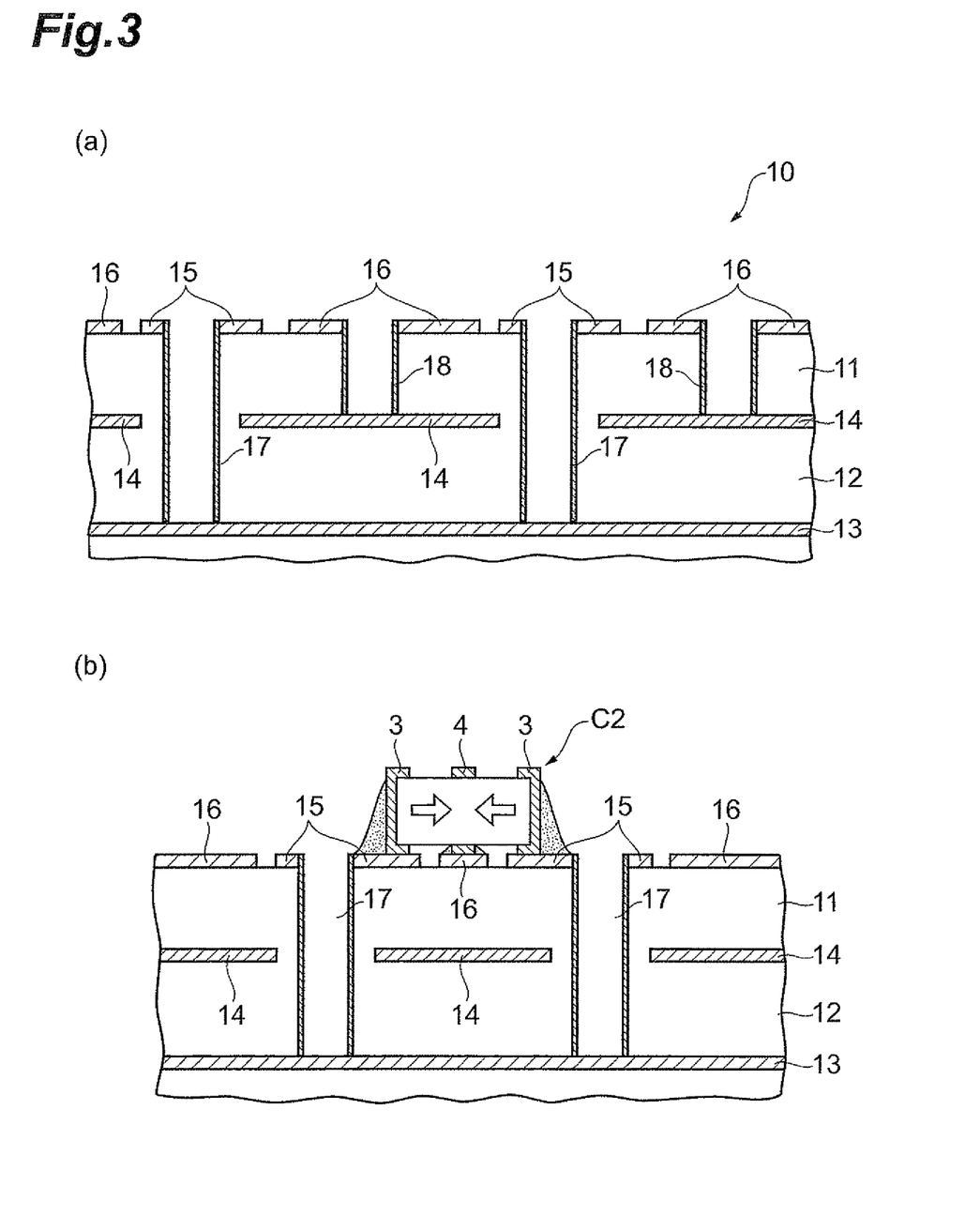
FIG. 3 is sectional views along line IIIa-IIIa and along line IIIb-IIIb in FIG. 2.

FIG. 1(*a*) is a perspective view of a feedthrough capacitor and FIG. 1(*b*) a top plan view of the feedthrough capacitor. FIG. 2 is a top plan view showing a feedthrough capacitor mounted structure according to the first embodiment. FIG. 3(*a*) is a sectional view along line IIIa-IIIa in FIG. 2 and FIG. 3(*b*) a sectional view along line IIIb-IIIb in FIG. 2. FIG. 2 is depicted without illustration of soldered portions between feedthrough capacitors and a substrate, for better viewing of the drawing.

The feedthrough capacitor mounted structure with feedthrough capacitors on the substrate according to the first embodiment will be described below with reference to FIGS. 1 to 3.

The feedthrough capacitor C1 is a so-called 3-terminal feedthrough capacitor. The feedthrough capacitor C1, as shown in FIG. 1(*a*), is constructed with a capacitor element body 2 of a nearly rectangular parallelepiped shape, a pair of terminal electrodes 3, and a pair of ground electrodes 4.

The terminal electrodes 3 are formed so as to cover a pair of end faces 2*a*, respectively, opposed to each other in the longitudinal direction in the capacitor element body 2. The terminal electrodes 3 are formed in a multilayered structure, in which a base layer in contact with the capacitor element body 2 is, for example, a sintered electrode layer of Cu, Ni, or Ag—Pd and in which a surface layer is, for example, a plated layer of Ni, Sn, or the like. The ground electrodes 4 are formed on approximate center regions, respectively, of a pair of end faces 2*b* perpendicular to the end faces 2*a*, in the capacitor element body 2, and are opposed to each other. The ground electrodes 4 are also formed in a multilayered structure as the terminal electrodes 3 are. The ground electrodes 4 are electrically insulated from the terminal electrodes 3 on the surface of the capacitor element body 2.

In the feedthrough capacitor C1, electric currents flow from the terminal electrodes 3 toward the ground electrodes 4, as indicated by arrows in FIG. 1(*b*).

The substrate 10 has a mounting surface on which the feedthrough capacitor C1 is mounted. The substrate 10 is an insulating substrate and has a multilayer structure as shown in FIG. 3(*a*), in which a first insulator layer 11, a second insulator layer 12, a power-side conductor layer 13, and a ground-side conductor layer 14 are stacked. The insulator layer 11 is laid between the mounting surface and the ground-side conductor layer 14 and the insulator layer 12 is laid between the ground-side conductor layer 14 and the power-side conductor layer 13.

The substrate 10 has power-side via holes 17 and ground-side via holes 18. The power-side via holes 17 extend from the mounting surface through the first and second insulator layers 11, 12 to the power-side conductor layer 13. The ground-side via holes 18 extend from the mounting surface through the first insulator layer 11 to the ground-side conductor layer 14.

When the substrate 10 is viewed from the mounting surface side, as shown in FIG. 2, the power-side via holes 17 and the ground-side via holes 18 are formed in a matrix pattern. The power-side via holes 17 and the ground-side via holes 18 are alternately arranged in each of the row direction and the column direction.

The substrate 10 has power-side land electrodes 15 and a ground-side land electrode 16. The power-side land electrodes 15 and the ground-side land electrode 16 are located on the mounting surface of the electrode substrate 10.

The power-side land electrodes 15 are formed on a principal surface of the first insulator layer 11 so as to surround apertures of the power-side via holes 17. There are a plurality of power-side land electrodes 15 of an island shape and one power-side land electrode 15 corresponds to one power-side via hole 17. Each power-side land electrode 15 is electrically connected through a corresponding power-side via hole 17 to the power-side conductor layer 13.

The ground-side land electrode 16 is formed on the principal surface of the first insulator layer 11 so as to surround apertures of the ground-side via holes 18. More specifically, the ground-side land electrode 16 is formed in the portion except for the regions where the power-side land electrodes 15 are formed, in the principal surface of the first insulator layer 11. There is a gap between the island-shape power-side land electrodes 15 and the ground-side land electrode 16 and the first insulator layer 11 is exposed through the gap. This makes the power-side land electrodes 15 and the ground-side land electrode 16 isolated from each other. The ground-side land electrode 16 is electrically connected through the plurality of ground-side via holes 18 to the ground-side conductor layer 14.

The aforementioned feedthrough capacitor C1 is mounted on the mounting surface of the substrate 10 in which the power-side land electrodes 15 and the ground-side land electrode 16 are formed. The feedthrough capacitor C1 is laid between a pair of power-side via holes 17*a*, 17*b* adjacent to each other in a direction intersecting with the row direction and also adjacent to each other in a direction intersecting with the column direction.

More specifically, the feedthrough capacitor C1 is laid between a pair of power-side via holes 17*a*, 17*b* adjacent in an oblique direction. In this connection, the feedthrough capacitor C1 is so arranged that one terminal electrode 3 of the feedthrough capacitor C1 is located on the power-side via hole 17*a* side and that the other terminal electrode 3 thereof is located on the power-side via hole 17*b* side. The one terminal electrode 3 of the feedthrough capacitor C1 is soldered to the power-side land electrode 15 corresponding to the power-side via hole 17*a* and the other terminal electrode 3 is soldered to the power-side land electrode 15 corresponding to the power-side via hole 17*b*. The pair of ground electrodes 4, 4 of the feedthrough capacitor C1 are soldered to the ground-side land electrode 16 located immediately below them. Such soldering results in electrically connecting the one terminal electrode 3 of the feedthrough capacitor C1 to the power-side conductor layer 13 through the power-side via hole 17*a*, electrically connecting the other terminal electrode 3 of the feedthrough capacitor C1 to the power-side conductor layer 13 through the power-side via hole 17*b*, and electrically connecting the pair of ground electrodes 4, 4 of the feedthrough capacitor C1 to the ground-side conductor layer 14 through any one of the ground-side via holes 18.

In the first embodiment, feedthrough capacitors C2-C4, in addition to the feedthrough capacitor C1, are also mounted on the substrate 10. The feedthrough capacitors C2-C4 have the same configuration as the feedthrough capacitor C1. The feedthrough capacitors C2-C4 each are laid between a pair of power-side via holes 17 adjacent in an oblique direction and are electrically connected through the pair of power-side via holes 17 to the power-side conductor layer 13 as the feedthrough capacitor C1 is. The following via holes are different from each other: the power-side via holes 17a, 17b between which the feedthrough capacitor C1 is laid; the power-side via holes 17c, 17d between which the feedthrough capacitor C2 is laid; the power-side via holes 17e, 17f between which the feedthrough capacitor C3 is laid; and the power-side via holes 17g, 17h between which the feedthrough capacitor C4 is laid. Namely, the feedthrough capacitors C1-C4 are so arranged as to prevent two or more feedthrough capacitors from being electrically connected through a certain power-side via hole 17 to the power-side conductor layer 13.

In the mounted structure of the first embodiment having the above configuration, the power-side via holes 17 connected to the power-side conductor layer 13 and the ground-side via holes 18 connected to the ground-side conductor layer 14 are alternately arrayed in the row direction and in the column direction in the substrate 10 on which the feedthrough capacitor C1 is mounted. Since the power-side via holes 17 and the ground-side via holes 18 through which electric currents flow in mutually opposite directions, are adjacent to each other, the ESL of the substrate 10 can be kept low.

The feedthrough capacitor C1 is located between the power-side via holes 17 adjacent to each other in the direction intersecting with the row direction and also adjacent to each other in the direction intersecting with the column direction. Namely, the feedthrough capacitor C1 is located between the power-side via holes 17 adjacent in the oblique direction. Since the power-side via holes 17 and the ground-side via holes 18 are alternately arranged in the row direction and in the column direction, there is no ground-side via hole 18 between the power-side via holes 17 adjacent in the oblique direction. Therefore, the feedthrough capacitor C1 can be mounted without existence of any unused via hole, which can increase the mounting density. Since there is no via hole under the feedthrough capacitor C1, this configuration prevents a solder from flowing into a via hole under the feedthrough capacitor C1 during soldering of the pair of terminal electrodes 3, 3 of the feedthrough capacitor C1. As a consequence, it is feasible to reduce mounting failure.

The distance between the power-side via holes 17a, 17b adjacent in the oblique direction is larger than the distance between the power-side via hole 17 and the ground-side via hole 18 adjacent in the row direction or in the column direction. For this reason, even if the distance between the power-side via hole 17 and the ground-side via hole 18 is set to a relatively smaller value, the feedthrough capacitor C1 can be mounted without any problem. Therefore, the array pitch of via holes can be set to a smaller value. When the array pitch of via holes is smaller, the power-side via holes 17 and the ground-side via holes 18 become closer to each other, which can further reduce the ESL of the substrate 10. When the array pitch of via holes is smaller, the number of via holes per predetermined area on the substrate 10 increases. The increase in the number of via holes permits a larger number of feedthrough capacitors to be mounted on the substrate 10, which can further increase the mounting density.

Second Embodiment

Figure 4:
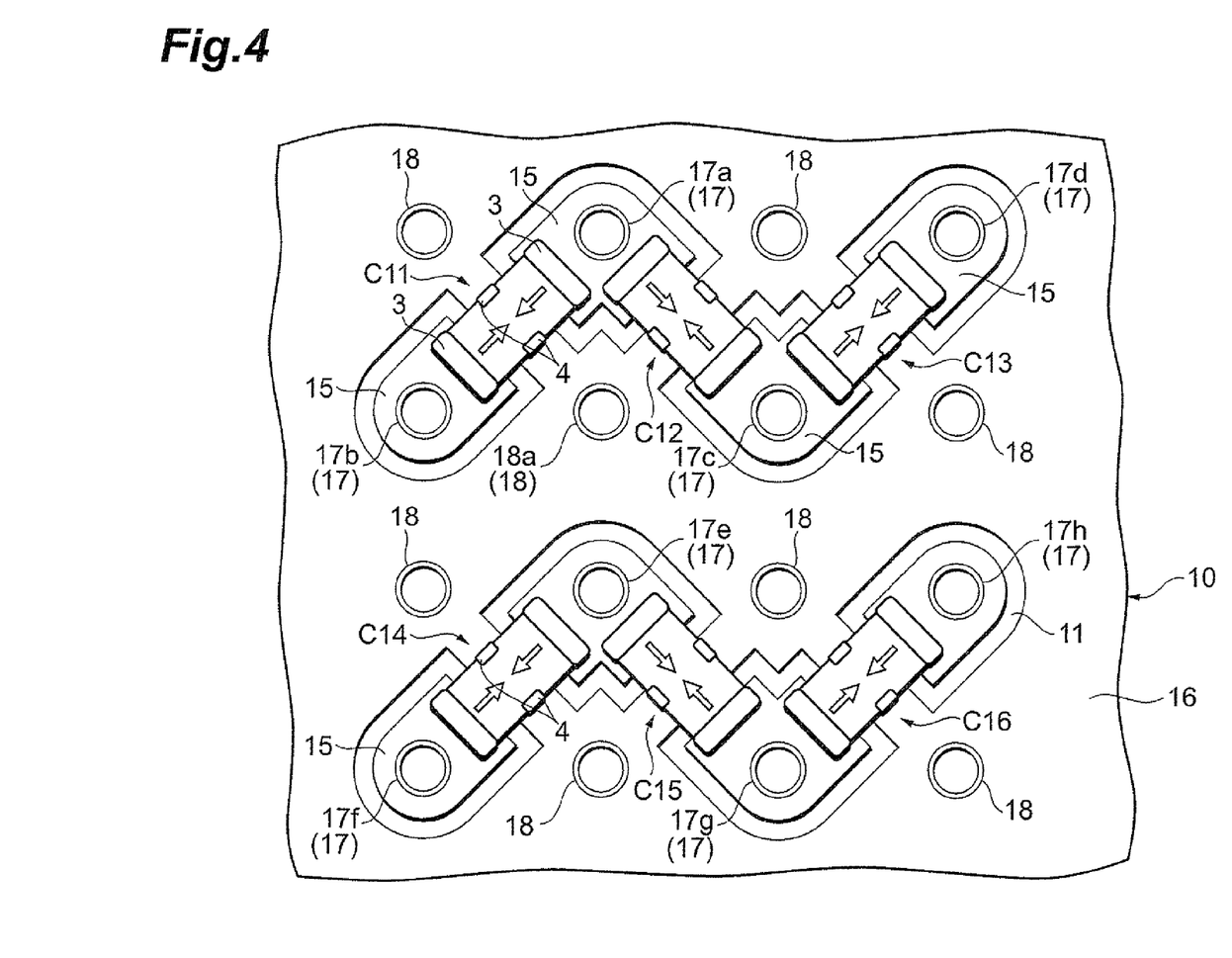
FIG. 4 is a top plan view showing a feedthrough capacitor mounted structure with feedthrough capacitors on a substrate according to the second embodiment.

The second embodiment will be described below based on FIG. 4. FIG. 4 is a top plan view showing a feedthrough capacitor mounted structure with feedthrough capacitors on a substrate according to the second embodiment. The feedthrough capacitors are soldered to the substrate in practice, but FIG. 4 is depicted without illustration of soldered portions between the feedthrough capacitors and the substrate, for better viewing of the drawing.

In the second embodiment, feedthrough capacitors C11, C12 are mounted on the mounting surface of the substrate 10. The feedthrough capacitors C11, C12 each have the same configuration as the feedthrough capacitor C1 in the first embodiment.

The feedthrough capacitor C11 is laid between a pair of power-side via holes 17 adjacent to each other in a direction intersecting with the row direction and also adjacent to each other in a direction intersecting with the column direction. The feedthrough capacitor C12 is laid between a pair of power-side via holes 17 adjacent to each other in a direction intersecting with the row direction and also adjacent to each other in a direction intersecting with the column direction. One power-side via hole 17 out of the pair of power-side via holes 17 between which the feedthrough capacitor C11 is laid, is the same as one power-side via hole 17 out of the pair of power-side via holes 17 between which the feedthrough capacitor C12 is laid. The other power-side via hole 17 out of the pair of power-side via holes 17 between which the feedthrough capacitor C11 is laid, is opposed to the other power-side via hole 17 out of the pair of power-side via holes 17 between which the feedthrough capacitor C12 is laid, with the ground-side via hole 18 in between.

More specifically, the feedthrough capacitor C11 is laid between a pair of power-side via holes 17a, 17b adjacent in an oblique direction. One terminal electrode 3 of the feedthrough capacitor C11 is located on the power-side via hole 17a side and the other terminal electrode 3 thereof is located on the power-side via hole 17b. The one terminal electrode 3 of the feedthrough capacitor C11 is soldered to the power-side land electrode 15 corresponding to the power-side via hole 17a and the other terminal electrode 3 is soldered to the power-side land electrode 15 corresponding to the power-side via hole 17b. The pair of ground electrodes 4, 4 of the feedthrough capacitor C11 are soldered to the ground-side land electrode 16 located immediately below the ground electrodes.

The feedthrough capacitor C12 is laid between a pair of power-side via holes 17a, 17c adjacent in an oblique direction. The power-side via hole 17c and the power-side via hole 17b are arrayed in the same row with one ground-side via hole 18a in between. One terminal electrode 3 of the feedthrough capacitor C12 is located on the power-side via hole 17a side and the other terminal electrode 3 thereof is located on the power-side via hole 17c side. The one terminal electrode 3 of the feedthrough capacitor C12 is soldered to the power-side land electrode 15 corresponding to the power-side via hole 17a and the other terminal electrode 3 thereof is soldered to the power-side land electrode 15 corresponding to the power-side via hole 17c. The pair of ground electrodes 4, 4 of the feedthrough capacitor C12 are soldered to the ground-side land electrode 16 located immediately below the ground electrodes.

The feedthrough capacitor mounted structure having the above configuration can control the ESL of the substrate 10 at a low level for the same reason as in the first embodiment. Since there is no via hole located immediately below each of the feedthrough capacitors C11, C12, the mounting density can be increased.

The one terminal electrode 3 of the feedthrough capacitor C11 and the one terminal electrode 3 of the feedthrough capacitor C12 both are electrically connected through the power-side via hole 17a to the power-side conductor layer 13. Since the two feedthrough capacitors C11, C12 are connected through one power-side via hole 17a, the mounting density can be increased more.

The feedthrough capacitor C11 and the feedthrough capacitor C12 are perpendicular to each other with the power-side via hole 17a at a top. For this reason, magnetic fields caused by electric currents cancel each other out in part in the feedthrough capacitor C11 and in the feedthrough capacitor C12. As a result, it becomes feasible to further reduce the ESL.

In the second embodiment, in addition to the feedthrough capacitors C11, C12, other feedthrough capacitors C13-C16 are also mounted on the substrate 10. The feedthrough capacitors C13-C16 have the same configuration as the feedthrough capacitors C11, C12. The feedthrough capacitor C13 is laid between power-side via holes 17c, 17d. The power-side via hole 17d is arranged in the same row as the power-side via hole 17a, with one ground-side via hole 18 in between. Therefore, the feedthrough capacitors C11-C13 are arranged in a zigzag pattern. When the feedthrough capacitors C11-C13 are arranged in the zigzag pattern, the feedthrough capacitor C12 cooperates with the feedthrough capacitor C11 to cancel out part of magnetic fields caused by electric currents. The feedthrough capacitor C12 also cooperates with the feedthrough capacitor C13 to cancel out part of magnetic fields caused by electric currents. Therefore, it becomes feasible to further reduce the ESL. The feedthrough capacitors C14-C16 are also arranged in the zigzag pattern as the feedthrough capacitors C11-C13 are.

Third Embodiment

Figure 5:
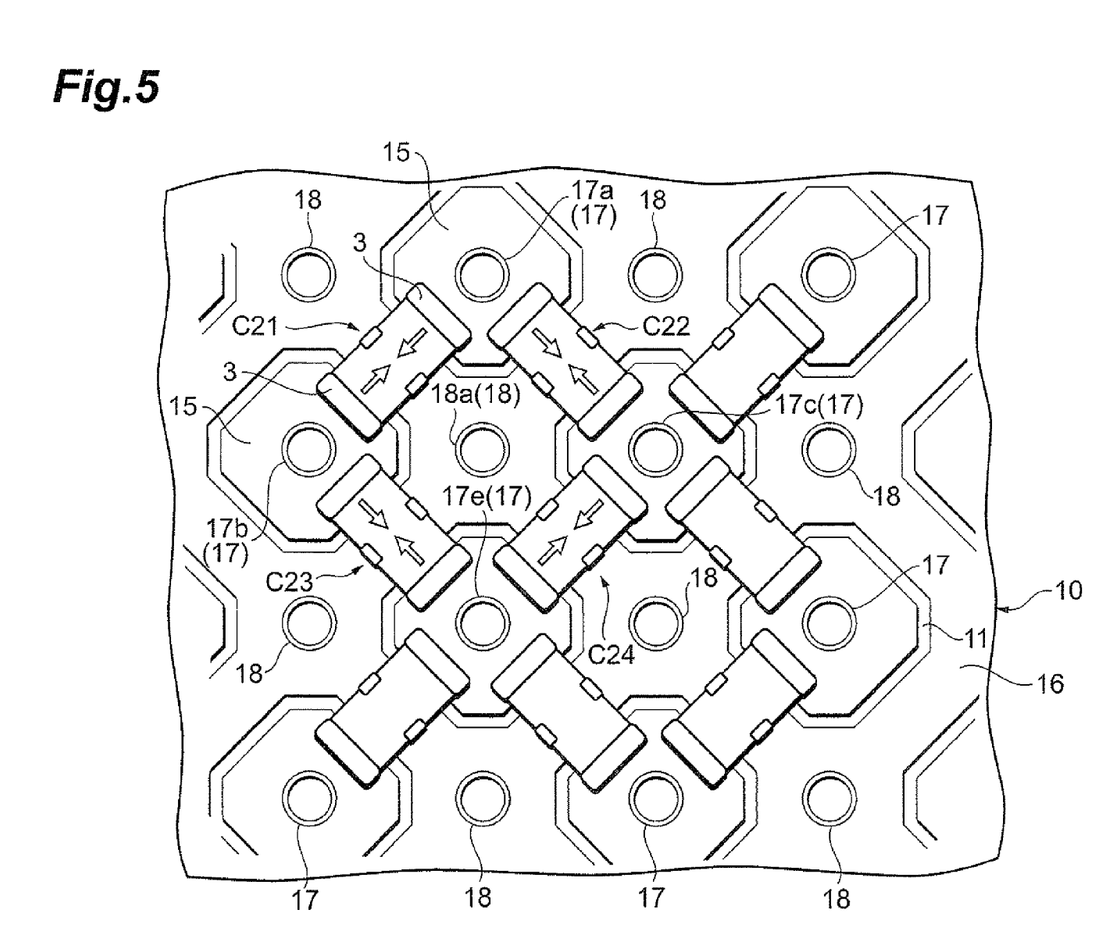
FIG. 5 is a top plan view showing a feedthrough capacitor mounted structure with feedthrough capacitors on a substrate according to the third embodiment.

The third embodiment will be described below based on FIG. 5. FIG. 5 is a top plan view showing a feedthrough capacitor mounted structure with feedthrough capacitors on a substrate according to the third embodiment. The feedthrough capacitors are soldered to the substrate in practice, but FIG. 5 is depicted without illustration of soldered portions between the feedthrough capacitors and the substrate, for better viewing of the drawing.

In the third embodiment, feedthrough capacitors C21-C24 are mounted on the mounting surface of the substrate 10. The feedthrough capacitors C21-C24 each have the same configuration as the feedthrough capacitor C1 in the first embodiment.

The feedthrough capacitor C21 is laid between a pair of power-side via holes 17a, 17b adjacent in an oblique direction. The terminal electrodes 3, 3 of the feedthrough capacitor C21 are connected to the respective power-side land electrodes 15 corresponding to the power-side via holes 17a, 17b.

The feedthrough capacitor C22 is laid between a pair of power-side via holes 17a, 17c adjacent in an oblique direction. As it was also described in the second embodiment, the power-side via hole 17b and the power-side via hole 17c are arranged in the same row with one ground-side via hole 18a in between. The terminal electrodes 3, 3 of the feedthrough capacitor C22 are connected to the respective power-side land electrodes 15 corresponding to the power-side via holes 17a, 17c.

The feedthrough capacitor C23 is laid between a pair of power-side via holes 17b, 17e adjacent in an oblique direction. The power-side via hole 17e and the power-side via hole 17a are arranged in the same column with one ground-side via hole 18a in between. The terminal electrodes 3, 3 of the feedthrough capacitor C23 are connected to the respective power-side land electrodes 15 corresponding to the power-side via holes 17b, 17e.

The feedthrough capacitor C24 is laid between a pair of power-side via holes 17e, 17c adjacent in an oblique direction. The terminal electrodes 3, 3 of the feedthrough capacitor C24 are connected to the respective power-side land electrodes 15 corresponding to the power-side via holes 17e, 17c.

The feedthrough capacitor mounted structure having the above configuration can also control the ESL of the substrate 10 at a low level for the same reason as in the first embodiment. Since there is no via hole immediately below each of the feedthrough capacitors C21-C24, the mounting density can be increased.

The four feedthrough capacitors C21-C24 are arranged to surround one ground-side via hole 18a. Therefore, the vector sum of electric current components in the four feedthrough capacitors C21-C24 becomes nearly zero and the four feedthrough capacitors C21-C24 cancel out magnetic fields caused by electric currents. As a consequence, it becomes feasible to further reduce the ESL.

The above described the preferred embodiments of the present invention, but it should be noted that the present invention does not always have to be limited to the above embodiments but can be modified in various ways without departing from the spirit and scope of the invention.

In the above embodiments, the terminal electrodes 3 are formed on the pair of end faces 2a opposed in the longitudinal direction in the capacitor element body 2 and the ground electrodes 4 are formed on the pair of end faces 2b perpendicular to the pair of end faces 2a. It is also possible to adopt a configuration wherein the ground electrodes 4 are formed on the pair of end faces 2a opposed in the longitudinal direction in the capacitor element body 2 and wherein the terminal electrodes 3 are formed on the pair of end faces 2b perpendicular to the pair of end faces 2a. In this case, directions of electric currents flowing in the feedthrough capacitor C1 become opposite to the arrows shown in FIG. 1(b). The feedthrough capacitor is laid between a pair of ground-side via holes 18, 18 adjacent in an oblique direction.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A feedthrough capacitor mounted structure in which a feedthrough capacitor is mounted on a mounting surface of a substrate, wherein the substrate is an insulating substrate internally having first and second conductor portions isolated from each other, and comprises a plurality of first via holes extending from the mounting surface to the first conductor portion, a plurality of second via holes extending from the mounting surface to the second conductor portion, a plurality of first land electrodes formed at respective positions corresponding to the first via holes on the mounting surface and connected to the corresponding first via holes, and a second land electrode formed on the mounting surface and connected to the second via holes in an isolated state from the first land electrodes, wherein the first via holes and the second via holes, when viewed from the mounting surface side, are arranged in a matrix pattern and alternately arranged in a row direction and in a column direction, wherein the feedthrough capacitor comprises an element body having a longitudinal direction, a pair of first terminal electrodes arranged on a pair of first end faces of the element body opposed in the longitudinal direction, and a second terminal electrode arranged on a second end face of the element body perpendicular to the longitudinal direction, wherein the feedthrough capacitor, when viewed from the mounting surface side, is located between a pair of said first via holes adjacent to each other in a direction intersecting with the row direction and also adjacent to each other in a direction intersecting with the column direction, wherein said pair of first terminal electrodes are connected to the respective first land electrodes corresponding to said pair of adjacent first via holes, and wherein the second terminal electrode is connected to the second land electrode.

2. A feedthrough capacitor mounted structure in which first and second feedthrough capacitors are mounted on a mounting surface of a substrate, wherein the substrate is an insulating substrate internally having first and second conductor portions isolated from each other, and comprises a plurality of first via holes extending from the mounting surface to the first conductor portion, a plurality of second via holes extending from the mounting surface to the second conductor portion, a plurality of first land electrodes formed at respective positions corresponding to the first via holes on the mounting surface and connected to the corresponding first via holes, and a second land electrode formed on the mounting surface and connected to the second via holes in an isolated state from the first land electrodes, wherein the first via holes and the second via holes, when viewed from the mounting surface side, are arranged in a matrix pattern and alternately arranged in a row direction and in a column direction, wherein each of the first and second feedthrough capacitors comprises an element body having a longitudinal direction, a pair of first terminal electrodes arranged on a pair of faces of the element body opposed in the longitudinal direction, and a second terminal electrode arranged on a face of the element body perpendicular to the longitudinal direction, wherein each of the first and second feedthrough capacitors, when viewed from the mounting surface side, is located between a pair of said first via holes adjacent to each other in a direction intersecting with the row direction and also adjacent to each other in a direction intersecting with the column direction, wherein said pair of first terminal electrodes are connected to the respective first land electrodes corresponding to said pair of adjacent first via holes, wherein the second terminal electrode is connected to the second land electrode, wherein one first via hole out of the pair of first via holes between which the first feedthrough capacitor is located, is the same as one first via hole out of the pair of first via holes between which the second feedthrough capacitor is located, and wherein the other first via hole out of the pair of first via holes between which the first feedthrough capacitor is located, is opposed to the other first via hole out of the pair of first via holes between which the second feedthrough capacitor is located, with the second via hole in between.

3. A feedthrough capacitor mounted structure in which first to fourth feedthrough capacitors are mounted on a mounting surface of a substrate, wherein the substrate is an insulating substrate internally having first and second conductor portions isolated from each other, and comprises a plurality of first via holes extending from the mounting surface to the first conductor portion, a plurality of second via holes extending from the mounting surface to the second conductor portion, a plurality of first land electrodes formed at respective positions corresponding to the first via holes on the mounting surface and connected to the corresponding first via holes, and a second land electrode formed on the mounting surface and connected to the second via holes in an isolated state from the first land electrodes, wherein the first via holes and the second via holes, when viewed from the mounting surface side, are arranged in a matrix pattern and alternately arranged in a row direction and in a column direction, wherein each of the first to fourth feedthrough capacitors comprises an element body having a longitudinal direction, a pair of first terminal electrodes arranged on a pair of faces of the element body opposed in the longitudinal direction, and a second terminal electrode arranged on a face of the element body perpendicular to the longitudinal direction, wherein each of the first to fourth feedthrough capacitors, when viewed from the mounting surface side, is located between a pair of said first via holes adjacent to each other in a direction intersecting with the row direction and also adjacent to each other in a direction intersecting with the column direction, wherein said pair of first terminal electrodes are connected to the respective first land electrodes corresponding to said pair of adjacent first via holes, wherein the second terminal electrode is connected to the second land electrode, wherein one first via hole out of the pair of first via holes between which the first feedthrough capacitor is located, is the same as one first via hole out of the pair of first via holes between which the second feedthrough capacitor is located, wherein the other first via hole out of the pair of first via holes between which the first feedthrough capacitor is located, is opposed to the other first via hole out of the pair of first via holes between which the second feedthrough capacitor is located, with the second via hole in between, and is the same as one first via hole out of the pair of first via holes between which the third feedthrough capacitor is located, wherein the other first via hole out of the pair of first via holes between which the third feedthrough capacitor is located, is opposed to the one first via hole out of the pair of first via holes between which the first feedthrough capacitor is located, with the second via hole in between, and is the same as one first via hole out of the pair of first via holes between which the fourth feedthrough capacitor is located, and wherein the other first via hole out of the pair of first via holes between which the fourth feedthrough capacitor is located, is the same as the other first via hole out of the pair of first via holes between which the second feedthrough capacitor is located.

* * * * *